United States Patent [19]

Ishido

[11] 4,095,174
[45] June 13, 1978

[54] SYSTEM FOR DETECTING LEAKAGE FAULTS IN A PIPELINE BY MEASURING THE DISTRIBUTED CAPACITANCE OF SECTIONS OF A SENSING CABLE BURIED PARALLEL TO SAID PIPELINE

[75] Inventor: Yasuhiro Ishido, Sayama, Japan

[73] Assignee: Towa Electric Co., Ltd., Japan

[21] Appl. No.: 760,223

[22] Filed: Jan. 18, 1977

[30] Foreign Application Priority Data

Jan. 22, 1976 Japan .................................. 51-005482

[51] Int. Cl.² ...................... G01R 31/08; G01R 27/26; G01M 3/04
[52] U.S. Cl. ................................... 324/52; 174/11 R; 324/61 R; 340/242
[58] Field of Search .................. 324/52, 66, 67, 60 R, 324/60 C, 61 R; 73/40.5 R; 340/242; 174/11 R

[56] References Cited

U.S. PATENT DOCUMENTS

| | | |
|---|---|---|
| 2,476,317 | 7/1949 | Nelson et al. ............................ 324/52 |
| 2,490,377 | 12/1949 | MacLean ............................. 324/52 X |
| 2,611,805 | 9/1952 | Osborn et al. ........................... 324/52 |
| 3,159,786 | 12/1964 | Bayne ................................. 324/67 X |
| 3,234,459 | 2/1966 | Brazee .................................... 324/52 |
| 3,452,272 | 6/1969 | Collins et al. ........................ 324/52 X |
| 3,600,674 | 8/1971 | Roberts .................................. 324/52 |
| 3,766,469 | 10/1973 | Nakane ................................ 324/60 C |
| 4,029,889 | 6/1977 | Mizuochi ............................ 324/52 X |

*Primary Examiner*—Gerard R. Strecker
*Attorney, Agent, or Firm*—George B. Oujevolk

[57] ABSTRACT

This invention relates to an arrangement for detecting the leakage fault of a pipeline by means of a sensing coaxial cable buried in parallel with the pipeline and divided into sections. When an oily substance such as petroleum leaks upon a portion of the sensing cable, the electric characteristics such as the impedance, or the distributed capacity of the cable will change. This change in the distributed capacity is used to detect a small variation in the cable caused by a small leakage of the oily substance, resulting in detecting the fault in the pipeline.

4 Claims, 14 Drawing Figures

SYSTEM FOR DETECTING LEAKAGE FAULTS IN A PIPELINE BY MEASURING THE DISTRIBUTED CAPACITANCE OF SECTIONS OF A SENSING CABLE BURIED PARALLEL TO SAID PIPELINE

BACKGROUND OF THE INVENTION

1. Field of the Invention

This invention relates to a system and method for detecting the leakage fault of a pipeline by a sensing cable, and more particularly to a system and method for detecting leakage of an oily substance from a petroleum pipeline by detecting a small change in the distributed capacity of a sensing cable buried in parallel with the pipeline.

2. Description of the Prior Art

There have heretofore been devised various methods for detecting leakage in a pipeline of this type such as a flow rate difference type at the inlet and outlet, a pressure wave type, a supersonic type, an insulating resistance deterioration detecting method buried in parallel with a coaxial cable of a pipeline, a detecting method by a pulse reflection, etc. However, considerable difficulties still exist from the standpoint of detecting accuracy, cost etc., so that a reliable detecting method for use on an industrial scale has not been discovered.

SUMMARY OF THE INVENTION

A primary object of this invention is therefore, to provide a system for detecting leakage in a pipeline by a sensing cable which can eliminate the aforementioned difficulties which contemplates supplying signals to a sensing coaxial cable divided into sections thereby sequentially detecting the distributed capacities of the respective cables so as to discover leakage in the pipeline.

Another object of this invention is to provide a system for detecting leakage in a pipeline by a sensing cable which is adapted to employ an operational amplifier in an input measuring circuit using low frequency signals so as to perform the measurements at a long distance along the pipeline.

A further object of this invention is to provide a system for detecting leakage in a pipeline by a sensing cable which uses guard rings or similar potential shields in connection with an input cable connected between an operational amplifier and the sensing cable so as to prevent the effects of the distributed capacity and noise of the input cable, so as to conduct long distance measurement of the pipeline.

Still another object of this invention is to provide a system for detecting leakage in a pipeline by a sensing cable which has a standard cable arranged in parallel with the sensing cable together with two oscillating cable systems supplied with signals of opposite phase thereby attaining the difference of the distributed capacities of the sensing cables through an operational amplifier as a comparator system so as to successively detect the distributed capacities of the sensing cables in the respective sections.

Still another object of the invention is to provide a method for detecting leakage in a pipeline by a sensing cable which can quickly and accurately detect leakage in the pipeline.

For a better understanding of the invention, as well as other objects and further features thereof, reference is made to the following detailed description to be read in conjunction with the accompanying drawings, wherein like elements in the several figures are designated by like reference numerals.

DESCRIPTION OF THE PREFERRED EMBODIMENTS

Figure 1:
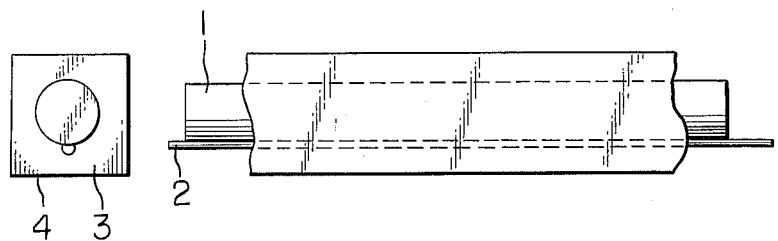
FIG. 1 is a schematic view of an example of a sensing coaxial cable buried in parallel with a pipeline.
Figure 2:
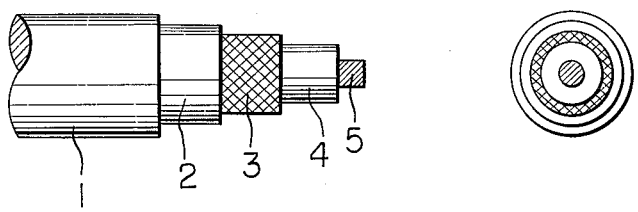
FIG. 2 is a schematic side view of the sensing coaxial cable used in this invention.

Referring now to FIGS. 1 and 2, which show the sensing coaxial cable arranged in parallel with the pipeline, the sensing cable comprises a protective coating insulator 1 made of "Gore-Tex" (trade name, newly developed porous polytetrafluoroethylene made in net or matrix structure under the control of its porosity at a predetermined value together with its relative dielectric constant controlled within a predetermined value for constant characteristic impedance, superior in oil-water separate film which can be penetrated by petroleum but repelling water) or polyester yarn wound on the outermost surface, an outer Gore-Tex tape winding 2, an outer conductive net 3 made of bare copper wire or silver, nickel plating, an inner Gore-Tex tape winding 4, and an inner conductor 5 made of the same material as that of the outer net 3, and thus maintains a predetermined constant characteristic impedance such as constant distributed capacity.

Another important property of this sensing cable is the separation of substance which has leaked such as crude oil, heavy oil, kerosin, light oil, gasoline, etc. from moisture. More particularly, the sensing cable allows oil to penetrate so as to filter the substance which has leaked but repels moisture and does not allow penetration by water. Such application of this property to the sensing cable will vary the characteristic impedance or relative dielectric constant such as distributed capacity of the sensing cable so as to detect a small leakage of substance from the pipeline so as to change the distributed capacity thereof. This feature will serve the same function for the substance which has leaked containing underground water and the like so that the sensing cable can filter oil content with less than 0.01 % of moisture content. This sensing cable also has another feature of high detecting speed. Even if substance which has leaked is immersed, the characteristic impedance will vary but it will not short-circuit. The sensing cable is chemically inert and is endurable against chemicals including agricultural chemicals.

Figure 3:
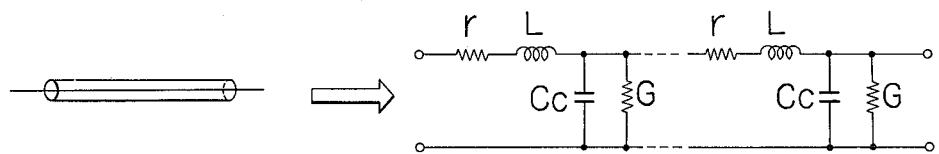
FIGS. 3 through 5 are equivalent circuits of the sensing cable.

Reference is now made to FIG. 3, which shows an equivalent circuit of the sensing cable.

Figure 4:
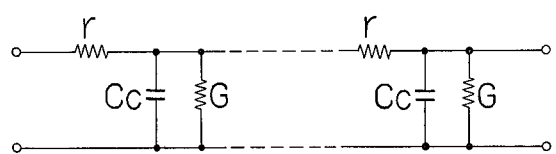
Figure 5:
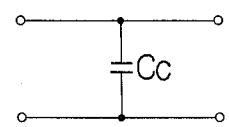

This sensing cable has a uniform inductance L per unit length, a loss resistance $\gamma$ per unit length, a conductance G per unit length and an admittance Cc (distributed capacity) per unit length, as shown. The loss resistance $\gamma$ and the conductance G are negligibly small for low frequency and low voltage measurements as illustrated in FIG. 4. Accordingly, since the inductance L does not affect low frequency computations, the equivalent circuit of the cable shown in FIG. 3 will become as shown in FIG. 5, having only the distributed capacity Cc. This distributed capacity, when measured, gives a criterion for the extent of change caused by a substance leaking. It is possible from the measured change in distributed capacity to be used to detect with high precision the amount of the substance leaking, i.e., the extent of the leak.

Figure 6:
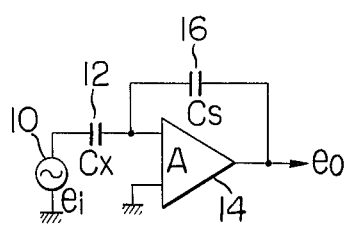
FIG. 6 is a view of schematic circuit diagram employing an operational amplifier for describing a capacity measuring method.

The method for measuring distributed capacity Cc is shown in FIG. 6, which illustrates the fundamental method for measuring capacity by means of an operational amplifier. As shown, the output of an oscillator 10 is represented by $e_i$, the capacitance of a sample 12 by Cx, the feedback capacity of the operational amplifier 14 by Cs, and the open loop gain of the operational amplifier 14 by A, and the output $e_o$ is given as $$e_o = \frac{C_x}{C_s} \cdot \frac{1}{[1 + \frac{1}{A}(1 + Cx/Cs)]} \cdot e_i \quad (1)$$

or $$e_o = \frac{C_x}{C_s} \cdot e_i \quad (2)$$

Since an operational amplifier generally has a value of $10^3$ to $10^6$ for its gain A, the output $e_o$ may be considered to be given by $E_q$ (2).

Figure 7:
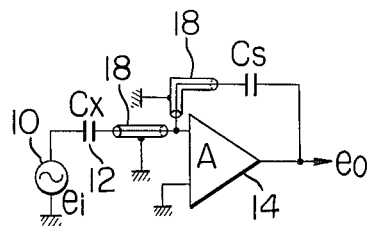
FIGS. 7 through 9 are explanatory views of the schematic circuit arrangements adopting the input cable.
Figure 8:
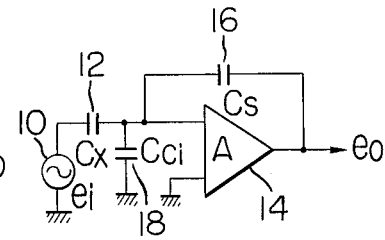

Now consider the remote measurement, as shown in FIG. 7, using a cable 18 at the input. The equivalent circuit for this cable 18 at low frequencies is as illustrated in FIG. 8 as with the sensing cable, so that the output $e_o$ is given as $$e_o = \frac{C_x}{C_s} \cdot \frac{1}{[1 + \frac{1}{A}(1 + Cx/Cs + C_{ci}/Cs)]} \cdot e_i \quad (3)$$

$$= \frac{C_x}{C_s} \cdot e_i \quad (4)$$

where $C_{ci}$ is the distributed capacity.

It is evident from Eq (3) that, for the remote measurement, an error results from the distributed capacity $C_{ci}$ of the input cable 18. This is because the value of the term $C_{ci}/C_s$ becomes larger as the input cable 18 is lengthened. The way to minimize this effect is to maximize the open loop gain A of the amplifier 14 so that the term $1/A \cdot (1 + Cx/Cs + C_{ci}/Cs)$ of Eq (3) may be neglected. This term has been found to be equal to the loop gain 1/A for the amplifier 14, so that the amplifier 14 approaches an ideal operational amplifier with improving linearity as the value of 1/A reduces.

Eventually Eq (3) becomes equivalent to Eq (2), which means that the effect of $C_{ci}$ may be made insignificant with sufficient display of the guard ring effect or equal potential shield even if the input cable 18 extends for a considerable length.

Figure 9:
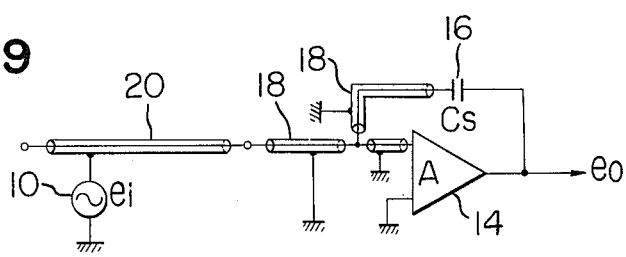
Figure 10:
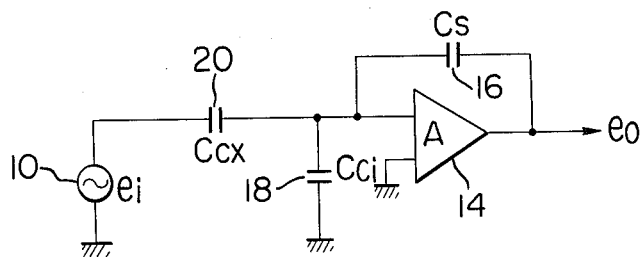
FIG. 10 is an equivalent circuit of the circuit shown in FIG. 9.

Furthermore, when a sensing cable 20, in place of the capacitance Cx of the sample 12, is subject to a measurement as shown in FIG. 9, we may form the equivalent circuit shown in FIG. 10, from which the output $e_o$ is derived as follows with $C_{cx}$ representing the distributed capacity of the sensing cable 20.

$$e_o = \frac{C_{cx}}{C_s} \cdot e_i \quad (5)$$

The above description concludes the explanation of the principle of determination of distributed capacity in a sensing cable 20 by low-frequency measurements. As Eqs (2) and (5) indicate, this method has the following characteristics:

Since the result by this method is independent of the measuring frequency, it becomes possible to adopt a low frequency for the measurement. The use of a low frequency contributes to a reduction in transmission losses, etc. which are inevitable in the pulse reflection method.

Even when the input cable 18 extends for a considerable distance, measurements at remote points may be carried out with high precision, since the use of guard rings or equal potential shield on the input cable 18 effectively reduces the errors in distributed capacity and at the same time shields the cable 18 against external noise.

Figure 11:
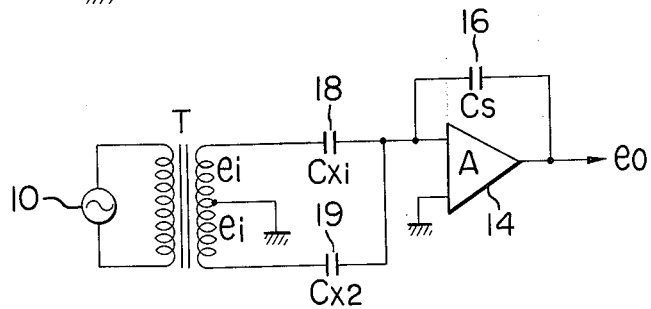
FIG. 11 is a view of the principle employing a comparator system therein.

In addition to the single measurement on the capacitance Cx of the sample 12 shown in FIG. 6, the operational amplifier 14 is characteristically capable of yielding weighted means as shown in FIG. 11. In FIG. 11, the input voltage is applied to the capacitances $C_{x1}$ and $C_{x2}$ of the samples 18 and 19 in opposite phases via the transformer T, and accordingly the output $e_o$ is given as follows by the same reasons as that for Eqs (1) to (5):

$$e_o = \frac{|C_{x1} - C_{x2}|}{C_s} \cdot e_i \quad (6)$$

where $C_s$ is feedback capacity.

Since the output $e_o$ is proportional to the term $|C_{x1} - C_{x2}|$, either the capacitance $C_{x1}$ or $C_{x2}$ of the samples 18 and 19 may be chosen as the standard output difference.

An application of the principle of Eq (6) as disclosed in FIG. 11 to the present method for leak detection can yield higher precision.

For example, there can be formed a circuit similar to that in FIG. 11 by replacing the capacitance $C_{x1}$ of the sample 18 with the sensing cable 20 and the capacitance $C_{x2}$ of the sample 19 with a cable which, though not for detection, is the same in electric properties as the sensing cable 20. The output, conforming to Eq (6) with the capacitance $C_{x2}$ of the sample 19 as the standard cable, is unaffected by external conditions such as temperature, etc; the quanity of the change due to the penetration of a substance leaking may be detected separately, i.e., a comparison therebetween is established which detects only the difference value.

Figure 12:
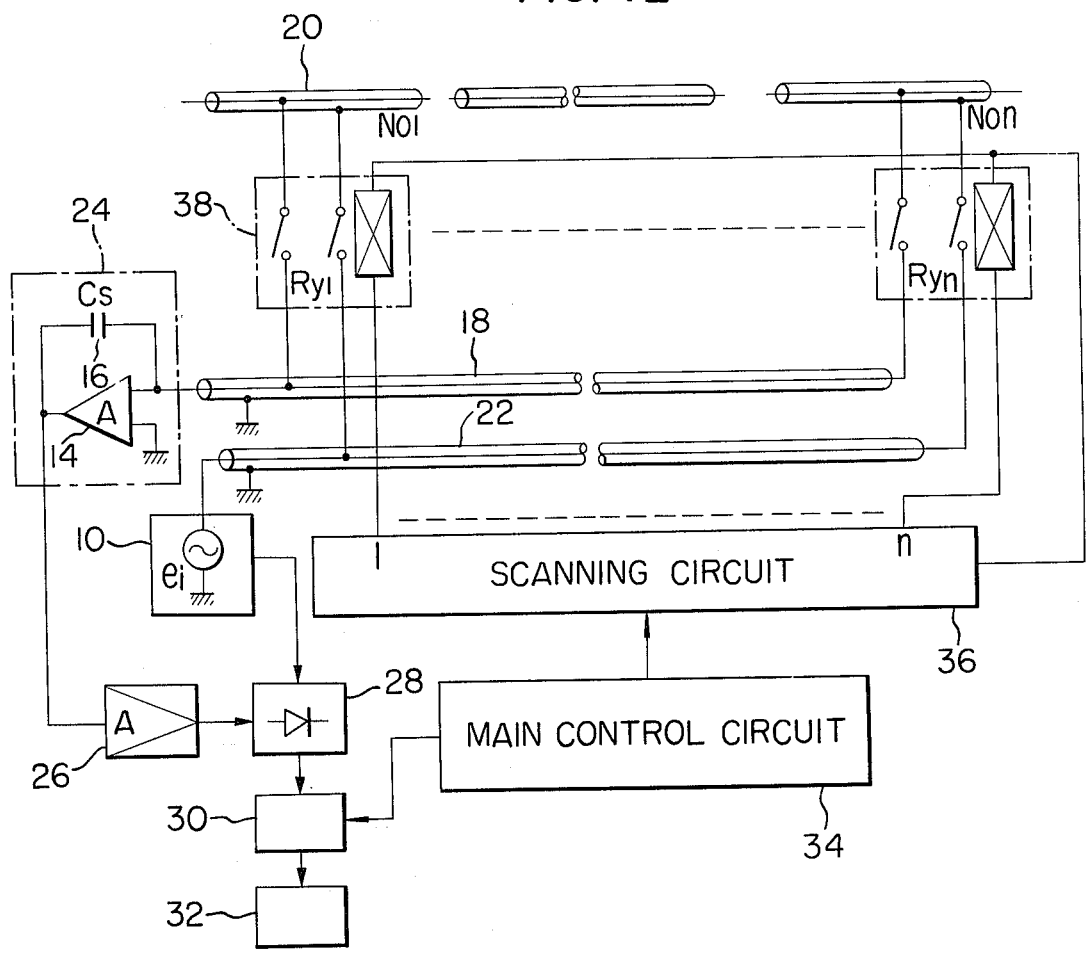
FIG. 12 is a practical block diagram of one embodiment of the system according to this invention.

Referring now to FIG. 12, which shows one embodiment of the system according to this invention, the system of this embodiment comprises a plurality of sensing or detection cables 20 divided into sections $N_{o1}$ to $N_{on}$ and buried in parallel with the pipeline, utilizing the fundamental circuit shown in FIGS. 6 to 10 based on Eq (2). Via the switching circuits 38 composed of individual circuits $R_{y1}$ to $R_{yn}$ the inner and outer conductors of the sensing cable 20 are led to the input cable 18 and the oscillator-side cable 22, respectively. When a main control circuit 34 generates scanning pulses, each switching circuit 38 is scanned via the scanning circuit 36, thus causing all the sections of the sensing cable 20 to be scanned in sequence. Thus, the distributed capacities of all the sections of the cable 20 are successively measured by means of the input measuring circuit 24.

The cables 18 and 22 should be grounded in order to protect them from external noise. Due allowance should be made for the distributed capacity $C_{ci}$ to ground of the input cable 18 which is given by Eq (3). The distributed capacity of the oscillator-side cable 22 to ground should be made negligible by sufficiently reducing the output impedance of the oscillator 10.

Now the signals detected by the input measuring circuit 24 are converted to DC current by the synchronous rectifying circuit 28 via the amplifier 26 and the output is then given by the output circuit 30. A synchronization of these outputs with the scanning pulses of the main control circuit 34 yields outputs corresponding to individual sections of the sensing cable 20 as shown in FIG. 14.

Figure 14:
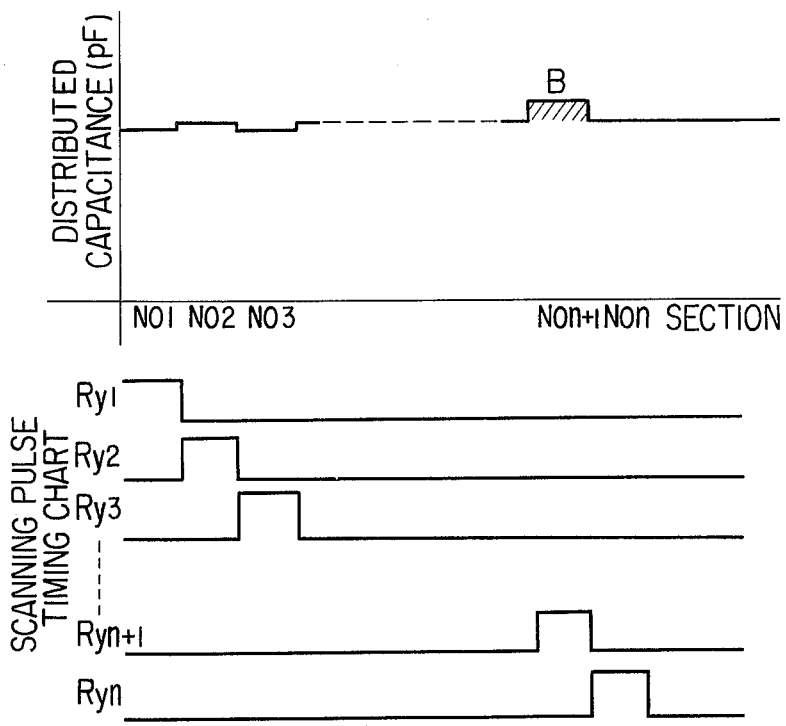
FIG. 14 is a chart of the output waveforms of the system in synchronization with the scanning pulses of the main control circuit of the system of this invention.

If leakage develops in a section, its distributed capacity changes; the output from the output circuit 30 will exhibit variations as shown by B in FIG. 14.

Figure 13:
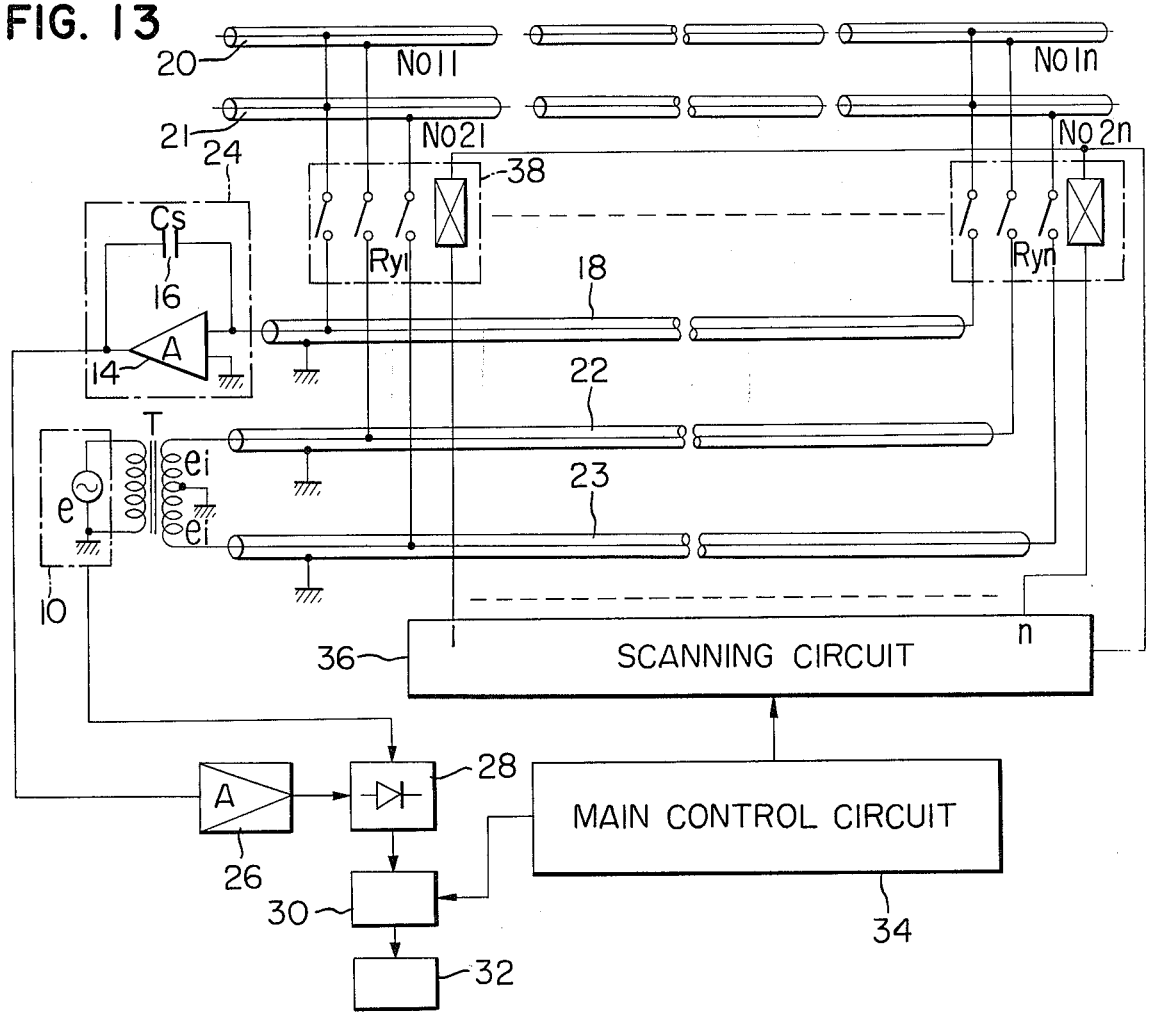
FIG. 13 is a block diagram of another embodiment of the system according to this invention.

In FIG. 13, which shows another embodiment of the system of this invention, employing the comparison as disclosed in FIG. 11 based on Eq (6), the sensing cable 20 and a standard cable 21 are buried in parallel with the pipeline. The cables 20 and 21 are divided into sections $No_{11}$ to $No_{1n}$ and $No_{21}$ to $No_{2n}$, respectively, and via the switching circuits 38 of the individual circuits $R_{y1}$ to $R_{yn}$ the inner conductors of the cables 20 and 21, the outer conductor of the cable 20, and the outer conductors of the cables 20 and 21 are led to the input cable 18, the oscillator-side cable 22, and the oscillator-side cable 23, respectively. The input voltage feeds the output of the oscillator 10 to the oscillator-side cables 22 and 23 via the transformer T. When the main control circuit 34 generates scanning pulses, each switching circuit 38 is scanned via the scanning circuit 36, thus causing all the distributed capacities of individual sections of the cables 20 and 21 to be sequentially compared, as shown by Eq (6), while being scanned and measured by the input measuring circuit 24.

The cables 18, 22, and 23 should be grounded in order to protect them from external noises. Due allowance should be made for the distributed capacity to ground $C_{ci}$ of the input cable 18. The distributed capacities of the oscillator-side cables 22 and 23 should be rendered negligible.

Now the signals detected by the input measuring circuit 24 are converted to DC current by the synchronous rectifying circuit 28 via the amplifier 26 and the output is then given by the output circuit 30. A synchronization of these outputs with the scanning pulses of the main control circuit 24 yields outputs corresponding to individual sections of the sensing cables 20 and 21 as differences from the distributed capacity of the standard cable 21.

It should be understood from the foregoing description that since this embodiment of the system of this invention is thus constructed, the comparison permits compensation for the effects of external conditions such as temperature, and that high-precision detection is possible of any changes in the disturbed capacity of the sensing cable due to its penetration by a leaking substance.

It will be understood that various changes in the details, materials, steps and arrangements of parts, which have been herein described and illustrated in order to explain the nature of the invention, may be made by those skilled in the art within the principle and scope of the invention as expressed in the appended claims.

What is claimed is:

1. A system for detecting leakage in an elongated pipeline comprising:
    (a) a sensing elongated coaxial cable (20) with inner and outer conductors divided into a plurality of sections of substantially equal electrical characteristics and arranged in substantial geometric parallel with the pipeline wherein there is a variation in the distributed capacity of said inner and outer conductors upon penetration by an oily substance, said variation serving to sense leakage of oily substance from the pipeline;
    (b) an input cable (18) and an oscillator cable (22) arranged substantially along said coaxial cable, switching circuits (38) connected to each of said sections, said switching circuits connecting said input and oscillator cables (18, 22) to the inner and outer conductors, respectively of said coaxial cable;
    (c) an input measuring circuit (24) connected to said input cable (18);
    (d) an oscillator (10) connected to said oscillator cable (22); and,
    (e) scanning means (34, 36) electrically coupled to said switching circuits for scanning the switching circuits and causing all the sections of said coaxial cable to be scanned in sequence, to thereby connect the sensing coaxial cable through said input cable to said input measuring circuit thereby successively measuring the distributed capacity of the sections of said coaxial cable by means of a signal given from said oscillator cable.

2. A system as set forth in claim 1, wherein said input measuring circuit comprises a low frequency signal operational amplifier.

3. A system as set forth in claim 2, including equal potential shields connecting the operational amplifier to said coaxial cable so as to prevent the distributed capacity of said input cable from being affected by noise to enable long distance measurements.

4. A system for detecting leakage in an elongated pipeline comprising:
    (a) a sensing elongated coaxial cable (20) and a standard elongated cable (21) divided into a plurality of sections of substantially equal electrical characteristics and arranged in substantial geometric parallel with the pipeline in a manner that said standard cable is protected from external effects, said cables each having inner and outer conductors, said coaxial cable varying in distributed capacity upon the penetration therein by an oily substance, said variation serving to sense leakage of an oily substance from the pipeline;
    (b) one input cable (18) and two oscillator cables (22, 23) arranged substantially along said coaxial and standard cables, switching circuits (38) connected to the inner conductors of each of said section of said coaxial and standard cables in parallel and likewise to the outer conductors of said coaxial and standard cables in parallel, respectively;

(c) an input measuring circuit connected with said input cable (18), including an operational amplifier coupled to said input cable;

(d) oscillator circuit means connected to said oscillator cables (22, 23) for producing signals of opposite phase in said oscillator cables; and, (e) scanning means (34, 36) electrically coupled to said switching circuit for scanning the switching circuits and causing all the sections of said coaxial cable to be scanned in sequence, to thereby connect the sensing coaxial cable and standard cable through said input cable to said input measuring circuit (24) thereby successively measuring the distributed capacity of the sections of said coaxial cable by means of the signal given from said oscillator cable.

* * * * *